United States Patent

Murakami et al.

Patent Number: 6,031,292
Date of Patent: Feb. 29, 2000

[54] SEMICONDUCTOR DEVICE, INTERPOSER FOR SEMICONDUCTOR DEVICE

[75] Inventors: Gen Murakami, Tokyo; Mamoru Mita, Ibaraki-ken; Toyohiko Kumakura, Ibaraki-ken; Norio Okabe, Ibaraki-ken; Katsuji Komatsu, Ibaraki-ken; Shoji Shinzawa, Ibaraki-ken, all of Japan

[73] Assignee: Hitachi Cable, Ltd., Tokyo, Japan

[21] Appl. No.: 08/896,836

[22] Filed: Jul. 18, 1997

Related U.S. Application Data

[62] Division of application No. 08/683,156, Jul. 18, 1996, Pat. No. 5,866,948.

[30] Foreign Application Priority Data

Jul. 18, 1995 [JP] Japan ..................... 7-181376

[51] Int. Cl.[7] .................................. H01L 23/48
[52] U.S. Cl. ............................ 257/778; 257/737
[58] Field of Search .......................... 257/700, 701, 257/778, 737, 738, 678

[56] References Cited

U.S. PATENT DOCUMENTS 5,371,407  12/1994  Goldman ................. 257/700
5,625,222   4/1997  Yoneda et al. ........... 257/700

FOREIGN PATENT DOCUMENTS

| | | |
|---|---|---|
| 63-3160 | 1/1988 | Japan . |
| 3-94459 | 4/1991 | Japan . |
| 3-269962 | 12/1991 | Japan . |
| 5-63109 | 3/1993 | Japan . |
| 5-144995 | 6/1993 | Japan . |
| 5-211202 | 8/1993 | Japan . |
| 5-283460 | 10/1993 | Japan . |
| 6-112354 | 4/1994 | Japan . |
| 6-216276 | 8/1994 | Japan . |

*Primary Examiner*—Carl Whitehead, Jr.
*Assistant Examiner*—Roy Potter
*Attorney, Agent, or Firm*—McDermott, Will & Emery

[57] ABSTRACT

A substrate 1 of a insulating resin material is provided with a semiconductor chip 2 in the center of the substrate 1 and a lot of fine studs are filled in the substrate 1 around the chip 2. A bonding pad 13 and a land 14 are formed on both end planes of each stud 12 by silver plating. The length of the stud 12 is determined so that the plane of the land 14 and the back side plane of the substrate are approximately co-planar, but it may be longer. The substrate 1 including the studs 12 having the bonding pad 12 and the land 14 is defined as an interposer 15.

9 Claims, 9 Drawing Sheets

13 BONDING PAD
16 DIE PAD
15 INTERPOSER

FIG. 11

27 STUD

SEMICONDUCTOR DEVICE, INTERPOSER FOR SEMICONDUCTOR DEVICE

This application is a division of application Ser. No. 08/683,156 filed Jul. 18, 1996 now U.S. Pat. No. 5,866,948.

BACKGROUND OF THE INVENTION

This invention relates to a semiconductor device, an interposer for a semiconductor device and a method for manufacturing the same, and more particularly to, a semiconductor device including a semiconductor chip, an interposer to be used as a substrate or a lead frame for mounting a semiconductor chip and a method for manufacturing the same.

A conventional semiconductor device having a ball grid array (BGA) packaging comprises a substrate, a semiconductor chip (IC, LSI chip) mounted on the surface of the substrate, first wiring patterns formed around the chip, each of which is connected to each pad on the chip by a bonding wire, second wiring patterns formed on back side of the substrate, throughholes having a plating on the inner surface thereof for connecting the first wiring pattern to the corresponding second wiring pattern, and solder balls for connecting the second wiring pattern to an input-output wiring pattern formed on a circuit board by a reflow solder. All parts mounted or formed on the surface of the substrate are covered by a molding resin.

Similar conventional devices and methods for manufacturing the same are known by many publications. For example, Japanese Published Patent Application no. 3-94459 discloses a semiconductor chip module comprising a die-bonding pad and a bonding pad having a non-etching metal layer such as a gold plating formed on a metal plate base, and a method for manufacturing the same. Japanese Published Utility-model Application no. 63-3160 discloses an integrated circuit device comprising a lead frame protruding from the back side of a resin package, and a heat-resisting insulating tape disposed on the same side thereof. Japanese Published Patent Application no. 5-63109 discloses a molded IC package comprising a contact hole formed inside a resin for conducting a inner lead to the surface or back side of a package, and a conductive filler filled into the contact hole so as to be used as an input-output contact. Japanese Published Patent Application no. 5-283460 discloses a semiconductor device comprising a semiconductor chip mounted on a insulating base-film on which a lead pattern is formed, and a bump connected to the lead pattern and exposed from the base-film. Japanese Published Patent Application no. 6-112354 discloses a thin over-molded semiconductor device comprising a semiconductor die mounted on a substrate having a conductive layer, and a solder ball connected to the conductive layer and exposed from the substrate, and a method for manufacturing the same. Japanese Published Patent Application no. 6-216276 discloses a semiconductor device comprising a wiring pattern formed on a substrate so that a plane thereof is higher than that of a substrate on which a semiconductor chip is mounted, and a throughhole, wherein the inner and outer ends of the wiring pattern is connected to the semiconductor chip and the throughhole, respectively, and a solder bump is connected to an exposed portion of the throughhole. Japanese Published Patent Application no. 5-144995 discloses a semiconductor package comprising a package substrate having a throughhole, and a metal ball interposed between the lower end of the throughhole and an input-output pattern on a circuit board. Japanese Published Patent Application no. 5-211202 discloses a composite flip-chip semiconductor device comprising a interposer having a plurality of conducting paths provided on both side of a substrate and a conductive trace for connecting the paths formed on the surface of the substrate, and a metal ball for connecting a flip-chip semiconductor device, and a method for manufacturing the same. Japanese Published Patent Application no. 3-269962 discloses a connecting member comprising a pair of resin holder for holding a conductive member in a manner that the conducting member protrudes from the resin holder, wherein the surface of the conductive member is coated by a solder.

In the conventional semiconductor devices, however, there are disadvantages as described below;

(a) such device as disclosed in Japanese Published Patent Application no.3-94459 comprises a large number of parts that the cost of materials and assembling cost become high.

(b) an effective inductance becomes high because the length of a wiring pattern is long. Therefore, crosstalk noise increases and high-speed transmission characteristics become worse in signal transmission.

(c) fatigue break due to thermal stress in heat cycle is likely to occur because there are a lot of wiring contacts in the device.

(d) reliability becomes worse because throughholes and solder balls themselves are easy to break due to fatigue.

SUMMARY OF THE INVENTION

Accordingly, it is an object of the invention to provide a semiconductor device, an interposer for a semiconductor device and a method for manufacturing the same by which a structure thereof is simple and a size thereof is small.

It is a further object of the invention to provide a semiconductor device, an interposer for a semiconductor device and a method for manufacturing the same by which effective inductance and noise in signal transmission are reduced.

It is a still further object of the invention to provide a semiconductor device, an interposer for a semiconductor device and a method for manufacturing the same by which the cost is low but reliability and productivity are high.

According to the first feature of the invention, a semiconductor device, comprises:

a substrate;

a semiconductor chip mounted on the substrate;

a plurality of conductive studs disposed around the semiconductor chip as input-output terminals; and a plurality of bonding wires for connecting each bonding pad on the semiconductor chip to the conductive studs, respectively;

wherein both side planes of the conductive stud are exposed from the surface and back side plane of the substrate, respectively, whereby the side planes function as a bonding pad and a land.

According to the second feature of the invention, an interposer for a semiconductor device, comprises the steps of: a substrate having a die pad where a semiconductor chip is to be mounted; and a plurality of conductive studs disposed around the die pad as input-output terminals;

wherein both side planes of the conductive stud are exposed from the surface and back side plane of the substrate, respectively, whereby the side planes function as a bonding pad and a land.

According to the third feature of the invention, a method for manufacturing an interposer for a semiconductor device, comprises the steps of:

preparing a substrate in which a plurality of holes are provided;

inserting conductive studs into each said hole.

BRIEF DESCRIPTION OF THE DRAWINGS

The invention will be explained in more detailed in conjunction with the appended drawings, wherein.

DESCRIPTION OF THE PREFERRED EMBODIMENTS

Before explaining in the first preferred embodiment, the aforementioned conventional semiconductor device will be explained in FIGS. 1, 2 and 3.

Figure 1:
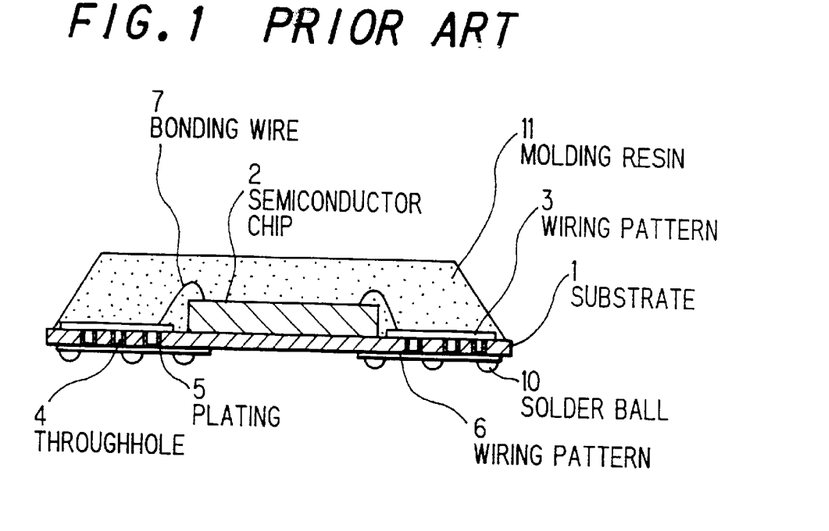
FIGS. 1 and 2 are a cross-sectional view and a plane view showing a conventional semiconductor device, respectively.
Figure 2:
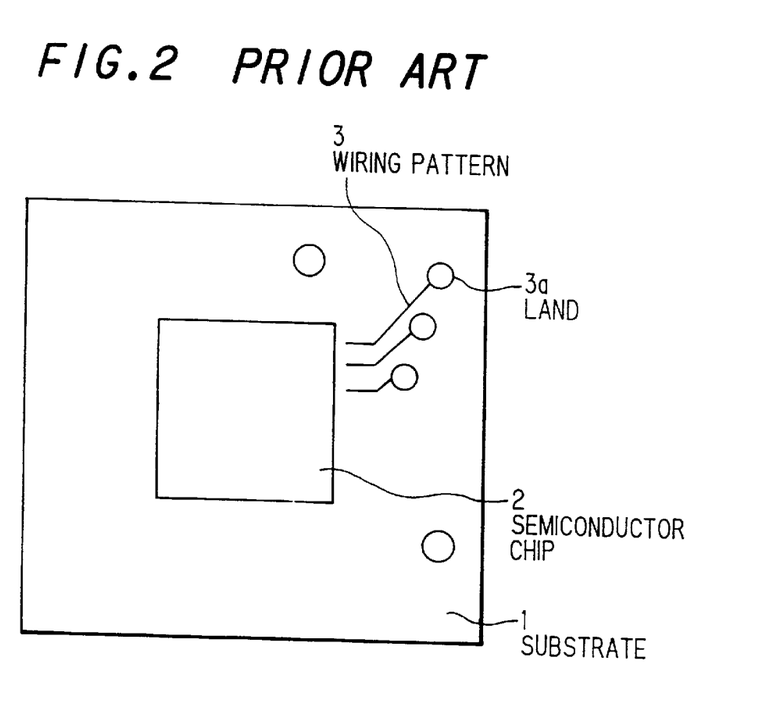

FIG. 1 shows the conventional semiconductor device having a ball grid array (BGA) packaging. The conventional semiconductor device comprises a substrate 1, a semiconductor chip 2 mounted on the surface of the substrate 1, first wiring patterns 3 formed around the chip 2, each of which is connected to each pad (not shown) on the chip 2 by a bonding wire 7, second wiring patterns 6 formed on back side of the substrate 1, throughholes 4 having a plating 5 on the inner surface thereof, land 3a, and solder balls 10. As shown in FIG. 2, wherein a molding resin 11 and some of first wiring patterns 3 are omitted, the first wiring pattern 3 is connected to the corresponding second wiring pattern 6 through the land 3a and the plating 5. Finally, all parts mounted or formed on the front side of the substrate 1 are covered by the molding resin 11, then the semiconductor device is complete.

Figure 3:
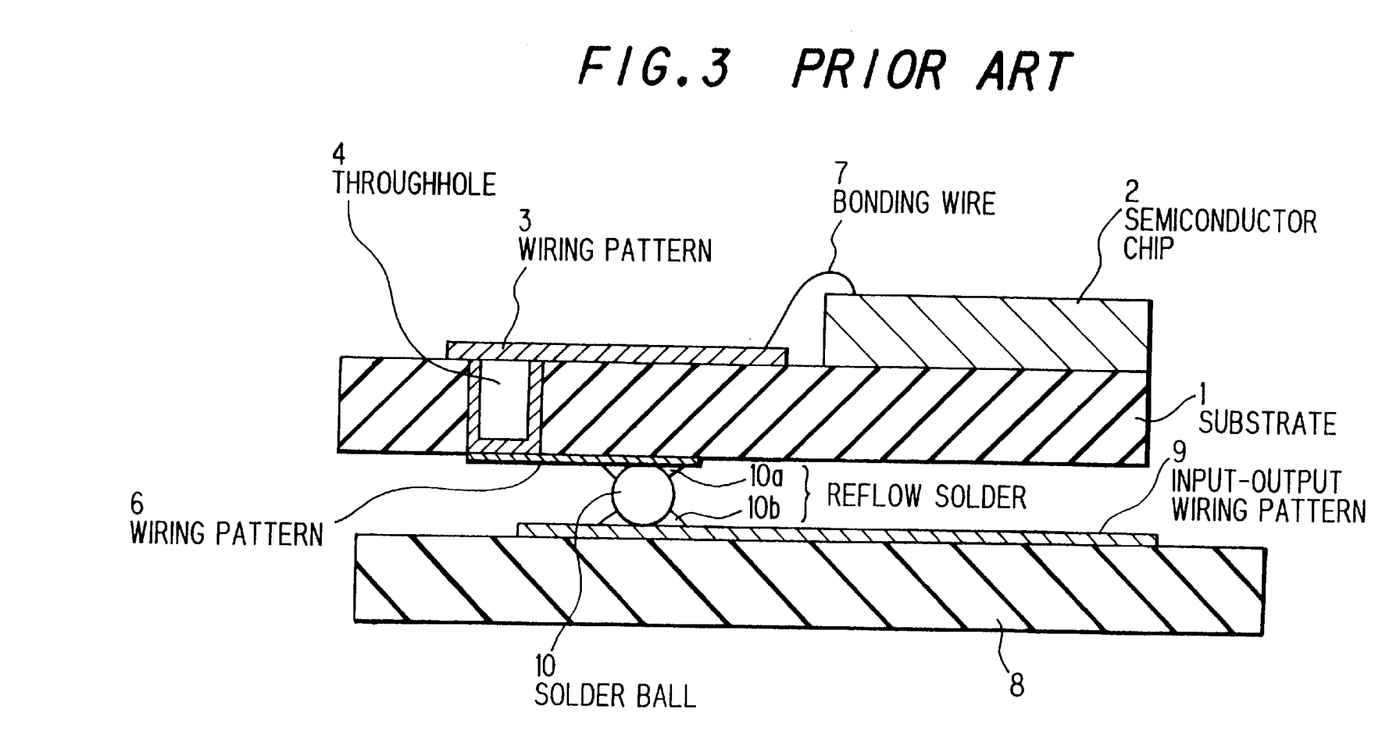
FIG. 3 is a cross-sectional view showing a conventional mounting structure of the semiconductor device to a circuit board.

FIG. 3 shows a conventional connecting structure of the semiconductor device to a circuit board, wherein the molding resin 11 is omitted. As shown in FIG. 3, this conventional semiconductor device is mounted on a circuit board 8 by connecting the second wiring pattern 6 on the back side of the substrate 1 to an input-output wiring pattern 9 formed on the circuit board 8 electrically and mechanically by reflow solders 10a and 10b melted by like a reflow heater.

In the conventional semiconductor device, as described before however, there are disadvantages in that;

(a) the cost of materials and assembling cost becomes high.

(b) an effective inductance becomes high. Therefore, crosstalk noise increases and high-speed transmission characteristics become worse in signal transmission.

(c) fatigue break due to thermal stress is likely to occur.

(d) reliability becomes worse.

Next, a semiconductor device, an interposer for a semiconductor device in the first preferred embodiment will be explained in FIGS. 4 and 5, wherein like parts are indicated by like reference numerals as used in FIGS. 1 and 2.

In the first preferred embodiment, a substrate 1, which is fabricated from a insulating resin material, is provided with an area in the center thereof where a semiconductor chip 2 is mounted, and a plurality of fine studs filled in the substrate 1 in a certain arrangement, by which the semiconductor chip 2 are surrounded. The number of the studs 12 is equal to that of the electrodes of the semiconductor chip 2. A bonding pad 13 for wire-bonding, and a land 14 which is used as a connecting terminal by soldering, are formed on both end planes of each stud 12, respectively. Preferably, the bonding pad 13 is formed by silver plating. In the embodiment, the length of the stud 12 is determined so that the plane of the land 14 and the back side plane of the substrate are approximately co-planar. However, it may be longer than the thickness of the substrate 1, i.e. the lower end plane of the stud 12 may protrude from the back side of the substrates, whereby a connection of the land 14 to an input-output wiring patter on a circuit board becomes easier. In the invention, the substrate 1 in which the studs 12 having the bonding pad 13 and the land 14 are filled is defined as an interposer 15.

According to the semiconductor device in the first preferred embodiment, the semiconductor 2, which is mounted on the interposer 15, is wire-bonded by a bonding wire 7 between the bonding pad 13 on the stud 12 and a bonding pad (not shown) on the semiconductor chip 2. Then the surface of the interposer 12, including the semiconductor chip 2, is molded by a molding resin 11, then the semiconductor device 20 is complete.

Figure 6:
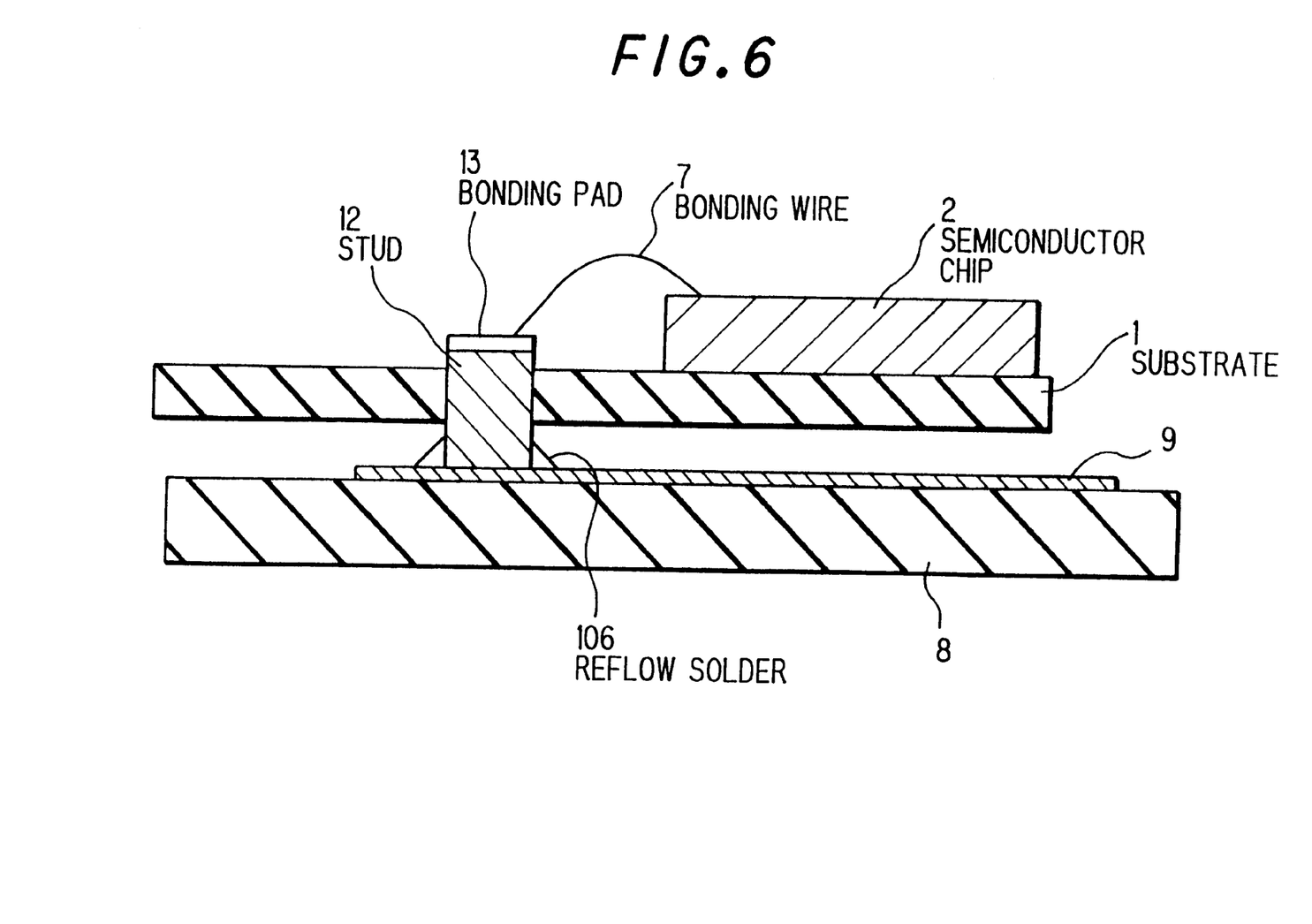
FIG. 6 is a cross-sectional view showing a mounting structure of the semiconductor device to a circuit board in the first preferred embodiment according to the invention.

FIG. 6 shows a mounting structure of the semiconductor device to the circuit board in the first preferred embodiment, wherein the molding resin 11 is omitted. As compared with the conventional connecting structure shown in FIG. 3, it is found that two wiring patterns 3 and 6, and three connecting points in the vicinity of each throughhole 4 which have been required in the conventional structure are not necessary in the embodiment.

According to the invention, as a fine stud has a function of both a conducting plating in a throughhole and a bonding pad, wiring patterns on both sides of a substrate are eliminated and the shortest length of connection is obtained. Therefore, an effective inductance and noise in signal transmission are reduced, and high speed operation in high clock frequency is possible. On top of that, the size of packaging becomes small, the number of parts is reduced, and the number of connecting terminals is increased. Therefore, a low cost, small, highly productive and highly reliable semiconductor device and interposer are obtained. In general, as a stud is made of copper and is heat-conductive, a heat radiation efficiency is improved. It is preferable to plate at least one end plane (wire-bonding side) of a stud by a gold or silver plating, whereby better bonding characteristics are obtained and reliability becomes high.

In the conventional structure, wiring patterns are necessarily provided for extracting bonding pads so close to a semiconductor chip. These days, the wire-bonding technique has been improved and a longer wire-bonding which is as long as about 15 mm is possible. Therefore, there is no problem with the invention, by omitting wiring patterns, which have a difficulty in fine fabrication.

Figure 7:
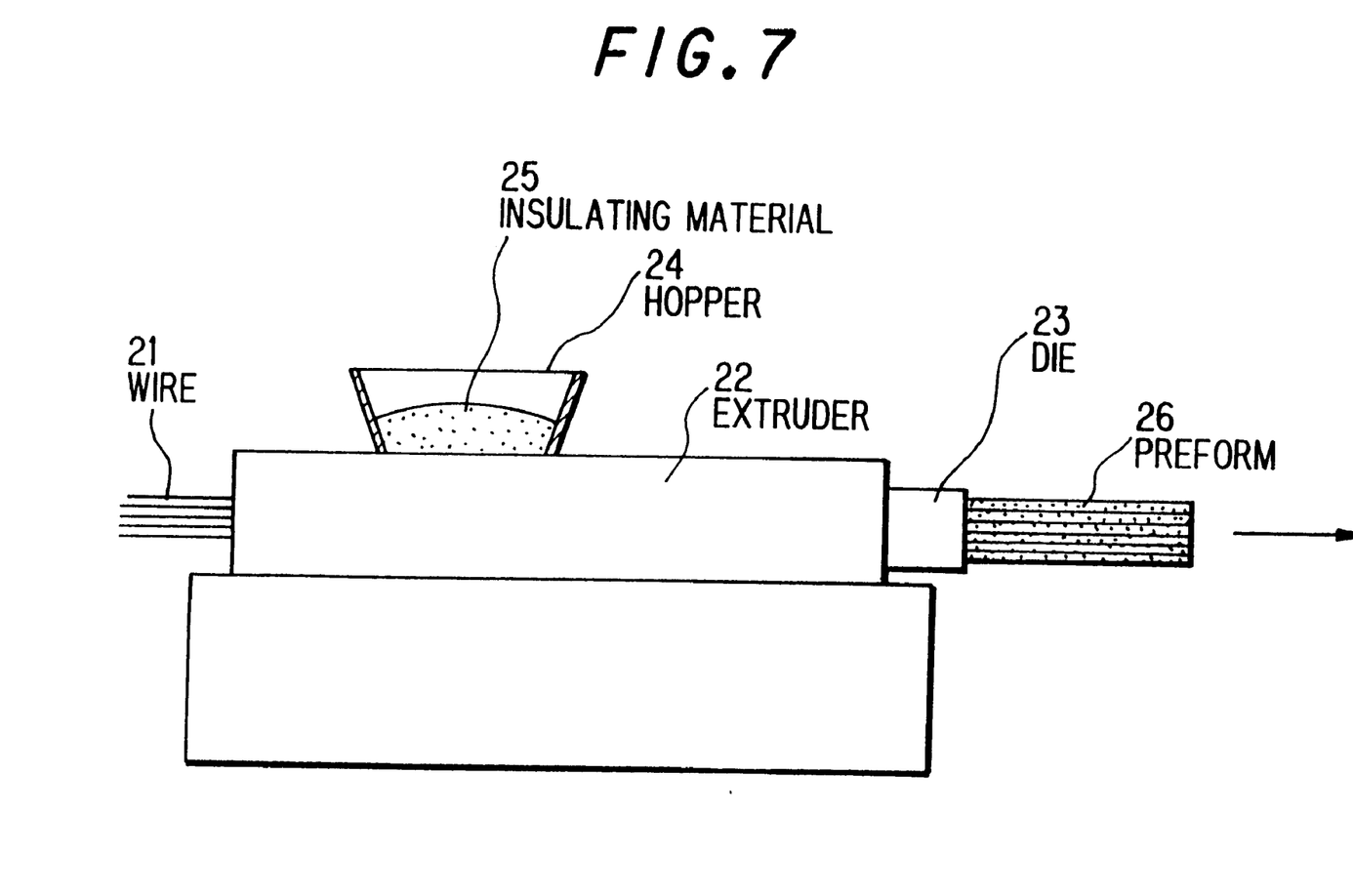
FIG. 7 is an explanatory view showing a method for manufacturing a preform for an interposer in the first preferred embodiment according to the invention.

FIG. 7 shows a method for manufacturing a preform for an interposer in the first preferred embodiment. A plurality of wires 21, such as oxygen-free copper (OFC) wires of 0.3 mm diameter, are supplied to an extruder 22. Pellets of an insulating material 25, such as thermoplastic fluorine resin, are also supplied from a hopper 24 to the extruder 22. The insulating material 25 is heated, melted at a die 23 and extruded among the wires 21, then, a continuous length of preform 26 for an interposer is obtained. The die 23 determines the disposition of each wire 21 and the outer shape of the preform 26, so it is exchangeable in every product or specification. Finally, the preform 26 is cut into slices as a basic structure for an interposer 17, which is as thick as about 1 mm.

Figure 4:
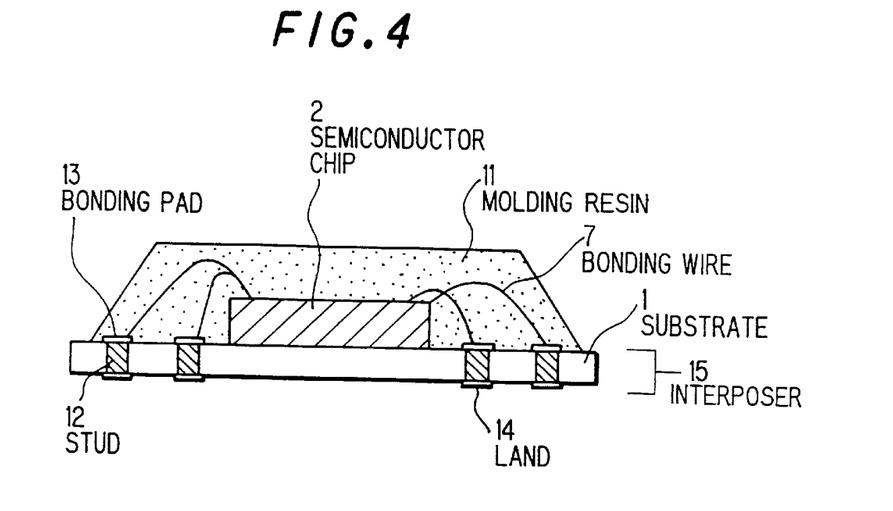
FIG. 4 is a cross-sectional view showing an interposer and a semiconductor device in a first preferred embodiment according to the invention.
Figure 5:
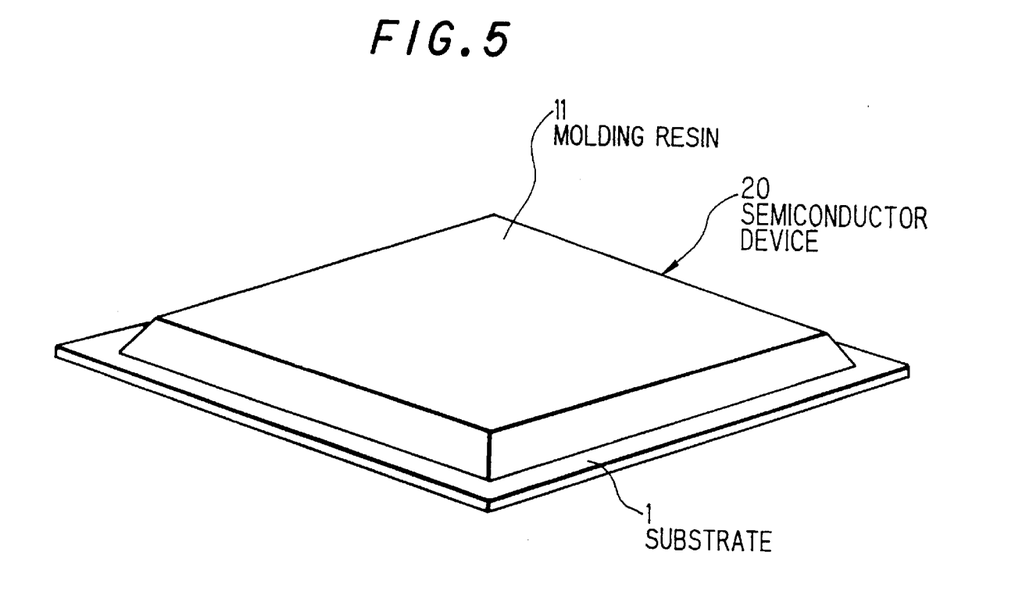
FIG. 5 is a perspective view showing a semiconductor device shown in FIG. 4.
Figure 8:
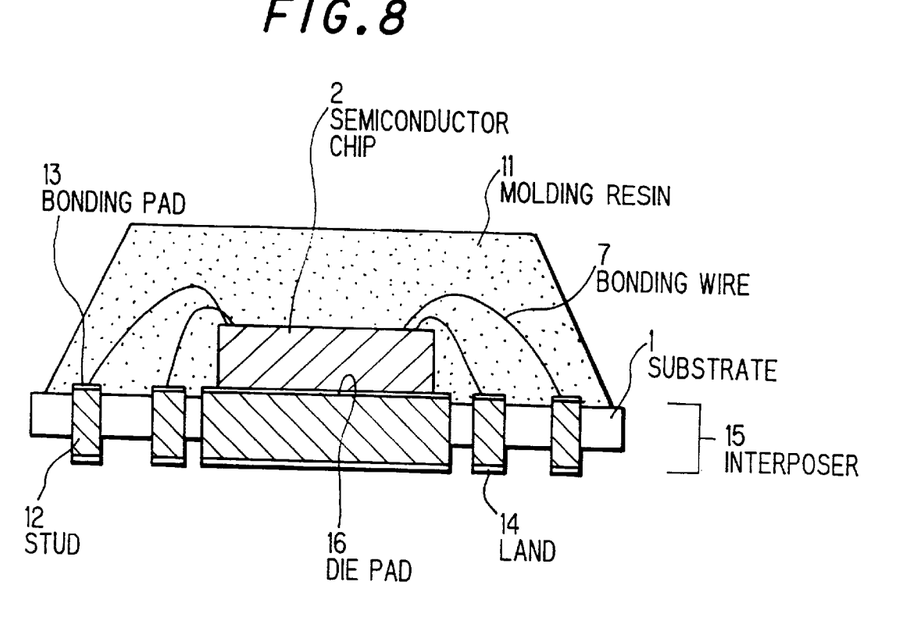
FIG. 8 is a cross-sectional view showing an interposer and a semiconductor device in a second preferred embodiment according to the invention.

FIG. 8 shows a semiconductor device in a second preferred embodiment, wherein like parts are indicated by like reference numerals as used in FIGS. 1 and 4. In the embodiment, a semiconductor chip 2 is attached on a die pad 16, which is fabricated in the center of a interposer 15. Studs 12 are longer than the thickness of a substrate 1, and both end plane of which are protruding and provided with a bonding pad 13 and a land 14, respectively. This interposer 15 having the die pad 16 and the studs 12 is made from a metal plate by the method described below.

Figure 9:
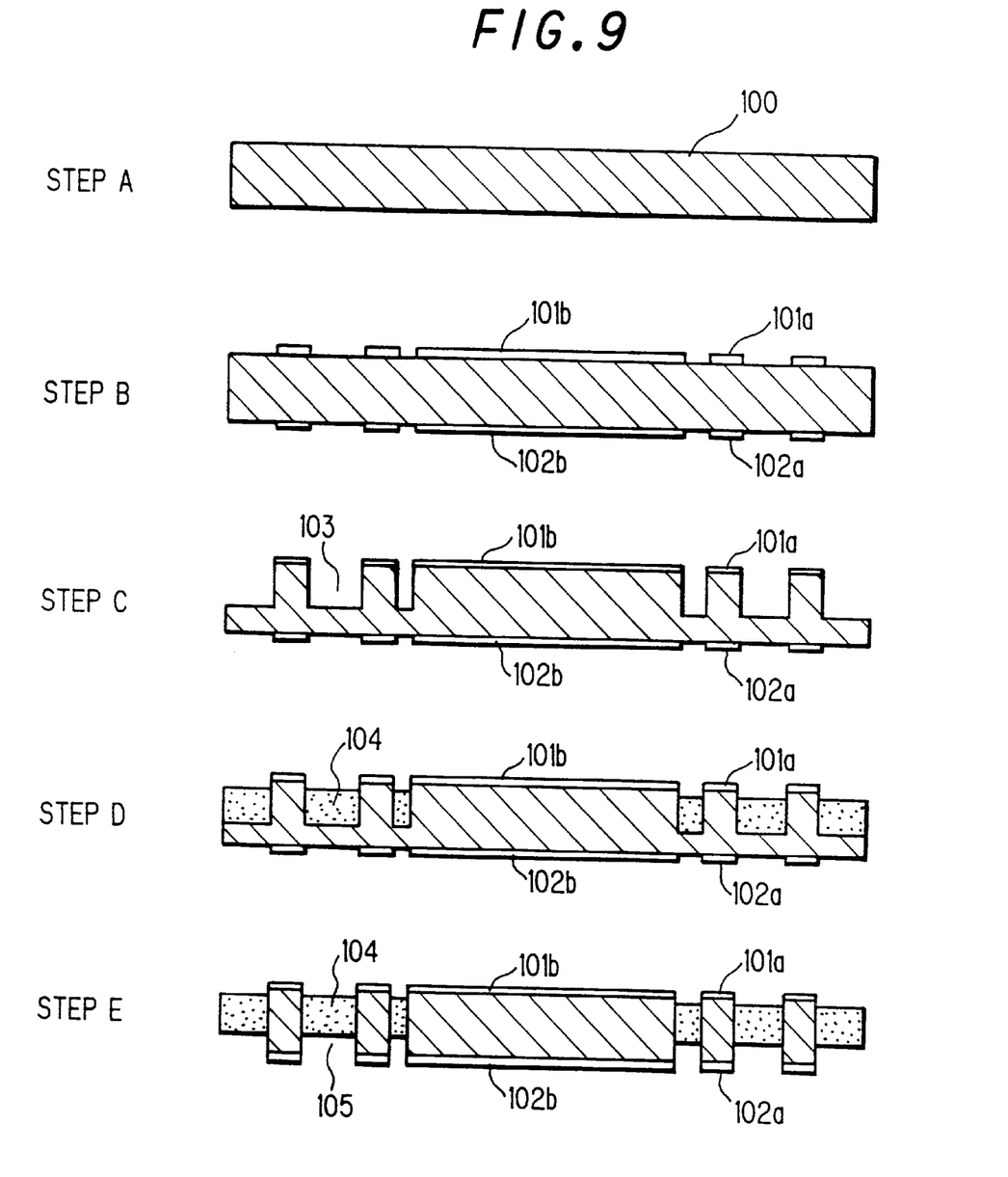
FIG. 9 is an explanatory view showing a method for manufacturing an interposer in the second preferred embodiment according to the invention.

As shown in FIG. 9, a metal plate 100, such as Fe-42%-Ni alloy, copper and copper alloy plate, is prepared (STEP A). Then, a number of plating pads of gold or silver, including bonding pads 101a, a die pad 10b, lands 102a and a bottom pad 102b are plated on both sides of the metal plate 100 (STEP B). Next, the surface of the metal plate 100 is etched 103 by photo-chemical etching using an etchant, such as ferric chloride aqueous solution. In this case, the bonding pads 101a and the die pad 101b function as masks against the etchant (STEP C). After that, an epoxy resin 104 is injected into the etched portion of the metal plate 100 so that the surfaces of the bonding pads 101a and the die pad 101b are still exposing (STEP D). Finally, the back side of the metal plate 100 is etched in the same manner, as deeply as the back side of the epoxy resin 104 is exposed (STEP E).

Figure 10:
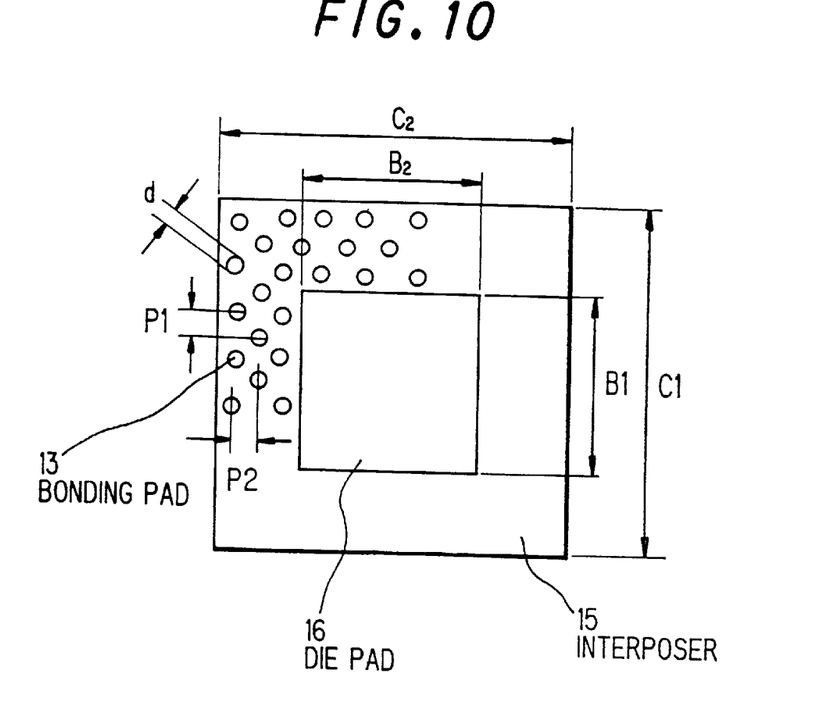
FIG. 10 is an explanatory view showing an example of a size and arrangement of parts in an interposer according to the invention.

FIG. 10 shows an example of a size and arrangement of parts in an interposer according to the invention. The interposer 15 of C1×C2 area includes a die pad 16 of B1×B2 area, a plurality of bonding pads having a diameter of d. Each bonding pad 13 is formed on the top plane of a stud 12 (not shown) and arranged all around the die pad 16 in a predetermined pitch, which is P1 in width direction and P2 in depth direction. Two types of examples of semiconductor device are manufactured by using such interposer 15, the value of each size, diameter, pitch (mm) are indicated in TABLE 1.

TABLE 1

| ITEM | SIGN | EXAMPLE 1 | EXAMPLE 2 |
|---|---|---|---|
| DIE PAD SIZE | B1 | 5.5 | 10.5 |
|  | B2 | 5.5 | 10.5 |
| PACKAGE SIZE | C1 | 10.0 | 20.0 |
|  | C2 | 10.0 | 20.0 |
| STUD PITCH | P1 | 0.5 | 0.5 |
|  | P2 | 0.5 | 0.5 |
| BONDING PAD DIAMETER | d | 0.3 | 0.3 |
| NUMBER OF PIN | n | 98 | 450 |

EXAMPLE 1

The interposer is fabricated by the method showing in FIG. 7, i.e. an extruded preform is cut into slices, cutting planes thereof are ground and polished, then nickel plating is provided on one end plane of a stud 12 by electroless plating (mean thickness of 1.0 µm, for example). Nickel plating is also provided on the other end plane thereof (mean thickness of 1.0 µm, for example), which is used as a land 16 (not shown). For obtaining a semiconductor device, a semiconductor chip 2 (5.0 mm square) is attached by silver past on the die pad 16 (5.5 mm square), then bonding pads thereon are connected to the bonding pad 13 on the stud 12 by bonding wire 7 (25 µm diameter gold wire, for example). The surface of the interposer 15 is molded by a molding resin 11. In this case, a potting resin of liquid epoxy is are molded by using a metal mask (1.0 mm thick) and printing technique.

As a result, the mounting area of the 98-pin semiconductor device package is quarter as large as that of the conventional one shown in FIG. 1. This is because the latter uses an glass epoxy resin substrate, an electro-migration through glass fibers in a high temperature, high humid environment is critical, so that the pitch of the throughholes is limited up to approximately 1.0 mm.

EXAMPLE 2

The size of the die pad and the semiconductor device package are determined as shown in TABLE 1. The mounting area of the 450- pin semiconductor device package is quarter as large as that of the conventional one.

Figure 11:
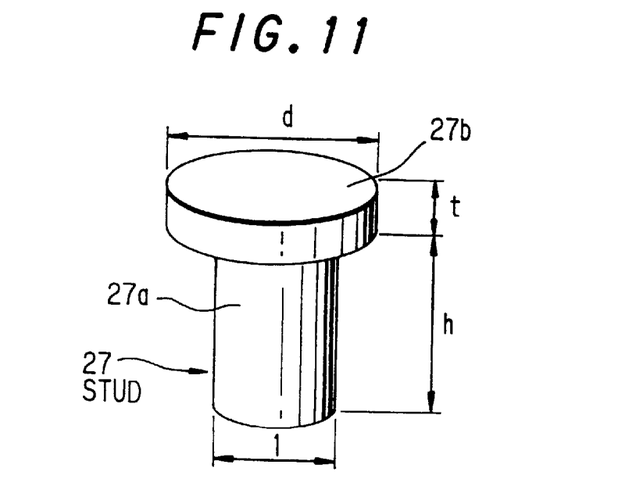
FIG. 11 is a perspective view showing a stud used in a third preferred embodiment according to the invention.
Figure 12:
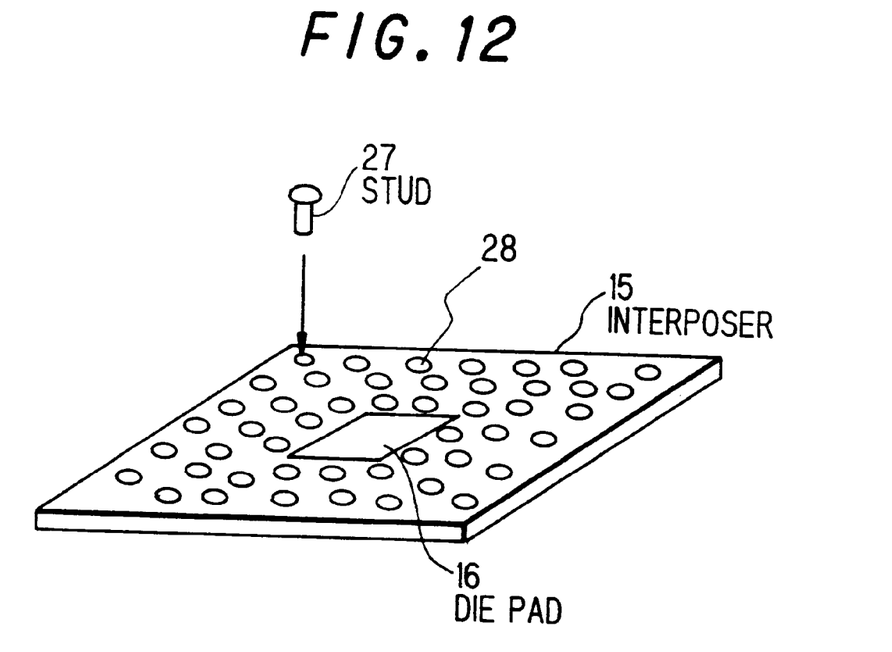
FIGS. 12 and 13 are a perspective view and a cross-sectional view showing an interposer in the third preferred embodiment, respectively.
Figure 13:
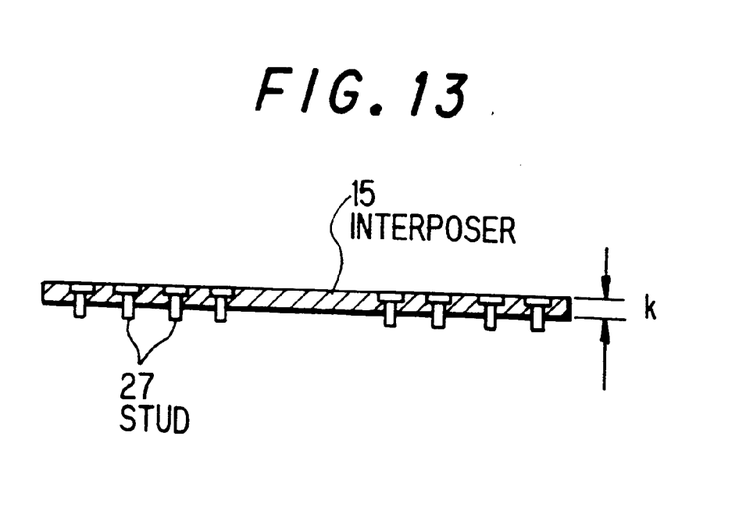

FIG. 11 shows a stud 27 used in a third preferred embodiment. In the embodiment, an OFC wire of 0.3 mm diameter having a silver plating layer of 3~5 µm thickness thereon is machined by a header machine (not shown), and a machine screw-shaped or a nail-shaped stud 27 is obtained. The stud 27 is provided with a swelled head 27b (diameter d, thickness t) at one end of a cylindrical body 27a (diameter i, height h). In this case, the silver plating has such a good extensibility that it still remains on the swelled head 27b after the machining. Therefore, it may function as a bonding pad. These studs 27 are inserted into each hole formed around a die pad 16 of an interposer 15 having a thickness k, as shown in FIG. 13. Such interposer may be manufactured by injection-molding of an epoxy resin and machining by a numerical control (NC) lathe. Two types of examples of semiconductor device are manufactured by using such interposer 15, the value of each size, diameter, pitch (mm) are indicated in TABLE 2.

TABLE 2

| ITEM | SIGN | EXAMPLE 3 | EXAMPLE 4 |
|---|---|---|---|
| DIE PAD SIZE | B1 | 5.5 | 10.5 |
|  | B2 | 5.5 | 10.5 |
| PACKAGE SIZE | C1 | 10.0 | 20.0 |
|  | C2 | 10.0 | 20.0 |
| STUD PITCH | P1 | 0.5 | 0.5 |
|  | P2 | 0.5 | 0.5 |
| STUD SIZE | d | 0.3 | 0.3 |
|  | t | 0.15 | 0.15 |
|  | h | 1.5 | 1.5 |
|  | i | 0.2 | 0.2 |
| NUMBER OF PIN | n | 98 | 450 |
| THICKNESS | k | 1.0 | 1.0 |

EXAMPLE 3

An interposer 17 having a thickness k of 1 mm epoxy resin, in which 98 holes are provided, is prepared, and studs 27 are inserted into the hole 28. Then, a semiconductor device is obtained in the same manner as explained in EXAMPLE 1. As a result, the mounting area of the 98-pin semiconductor device package is quarter as large as that of the conventional one.

EXAMPLE 4

The size of the die pad and the semiconductor device package are determined as shown in TABLE 2. The mounting area of the 450- pin semiconductor device package is quarter as large as that of the conventional one.

In the third embodiment, A solder ball, such as 63% Sn-Pb solder may be used to connect a land to an input-output wiring pattern easily and securely. In this case, printing reflow technique of solder paste may be used.

In the embodiment, not only the same advantages are obtained as in the first and second embodiments, but also heat radiation efficiency is much improved because machine screw or nail-shaped studs are molded in an interposer. In addition to that, fine studs are tightly united by a resin substrate and are prevented from slipping off or coming out of the substrate.

A stud having a same diameter in longitudinal direction may also be used, however, the difference of the position is likely to occur. If the stud has a swelled head, it is surely aligned in a predetermined position, and a wire-bonding is easily operated.

In the embodiment, other method for obtaining an interposer having a lot of studs may be used. For example, studs are positioned in an alignment jig, melted epoxy resin is poured into the jig with both ends of each stud exposed, then an interposer is obtained without insertion of studs. Therefore, machining or molding of a substrate is not necessary and productivity is improved.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A semiconductor device comprising:
    a substrate including:
        a surface side plane,
        a back side plane,
        a die pad disposed on said surface side plane for receiving a semiconductor chip, and
        a plurality of through holes positioned around said die pad;
    a semiconductor chip mounted on said substrate;
    a plurality of conductive studs all disposed around said semiconductor chip functioning as input-output terminals, each of said plurality of conductive studs including a first side plane and a second side plane, with said first side plane and said second side plane of each conductive stud being exposed respectively from the surface side plane and back side plane of said substrate for functioning respectively as a bonding pad and a land; and
    a plurality of bonding wires for connecting each bonding pad on said semiconductor chip to said conductive studs, respectively; wherein
    each of said plurality of conductive studs is a structural element of said substrate.

2. The semiconductor device according to claim 1, wherein at least one side plane of at least one conductive stud is plated for wire-bonding.

3. The semiconductor device according to claim 1, wherein at lease one conductive stud is a nail-shaped stud.

4. The semiconductor device according to claim 1, wherein at least one side plane of at least one conductive stud is plated by one of gold and silver.

5. The semiconductor device according to claim 1, wherein said substrate is an epoxy resin.

6. The semiconductor device according to claim 1, wherein said substrate and said plurality of conductive studs with respective bonding pad and land comprise an interposer.

7. A semiconductor device comprising:
    a substrate;
    a plurality of conductive studs disposed around said semiconductor chip as input-output terminals; and
    a plurality of bonding wires for connecting each bonding pad on said semiconductor chip to said conductive studs, respectively; wherein
    both side planes of said conductive stud are exposed from the surface and back side plane of said substrate, respectively, said side planes functioning as a bonding pad and a land, and each of said plurality of conductive studs is a structural element of said substrate, and
    said substrate is made of an insulating resin and at least one conductive stud is a fine wire molded in said substrate.

8. A semiconductor device comprising:
    a substrate;
    a plurality of conductive studs disposed around said semiconductor chip as input-output terminals; and
    a plurality of bonding wires for connecting each bonding pad on said semiconductor chip to said conductive studs, respectively; wherein
    both side planes of said conductive stud are exposed from the surface and back side plane of said substrate, respectively, said side planes functioning as a bonding pad and a land, and each of said plurality of conductive studs is a structural element of said substrate, and
    each of said plurality of conductive studs is a wire.

9. The semiconductor device according to claim 8, wherein the wire is an oxygen-free copper wire.

* * * * *